US008922168B2

(12) United States Patent
Ko

(10) Patent No.: US 8,922,168 B2
(45) Date of Patent: Dec. 30, 2014

(54) BATTERY MANAGEMENT SYSTEM AND BATTERY MANAGEMENT METHOD

(71) Applicant: LG Chem, Ltd., Seoul (KR)

(72) Inventor: Jongkyung Ko, Seoul (KR)

(73) Assignee: LG Chem, Ltd., Seoul (KR)

( * ) Notice: Subject to any disclaimer, the term of this patent is extended or adjusted under 35 U.S.C. 154(b) by 198 days.

(21) Appl. No.: 13/717,036

(22) Filed: Dec. 17, 2012

(65) Prior Publication Data

US 2013/0099754 A1    Apr. 25, 2013

Related U.S. Application Data

(63) Continuation of application No. PCT/KR2012/007933, filed on Sep. 28, 2012.

(30) Foreign Application Priority Data

Oct. 4, 2011 (KR) .................. 10-2011-0100887
Sep. 28, 2012 (KR) .................. 10-2012-0109005

(51) Int. Cl.
*H02J 7/00* (2006.01)

(52) U.S. Cl.
CPC ............. *H02J 7/00* (2013.01); *H02J 7/0021* (2013.01); *H02J 2007/005* (2013.01)
USPC ........................ 320/132; 320/134; 324/427

(58) Field of Classification Search
CPC ....... H02J 7/00; H02J 7/0021; H02J 2007/005
USPC ............................. 320/132, 134, 162; 324/427
See application file for complete search history.

(56) References Cited

U.S. PATENT DOCUMENTS

2005/0040789 A1 * 2/2005 Salasoo et al. ............... 320/119
2011/0288691 A1 * 11/2011 Abe et al. ..................... 700/292

FOREIGN PATENT DOCUMENTS

| JP | 2003-189502 A | 7/2003 |
| JP | 2004-85269 A | 3/2004 |
| JP | 2006-267014 A | 10/2006 |
| JP | 2007-292778 A | 11/2007 |
| KR | 10-2009-0052557 A | 5/2009 |

OTHER PUBLICATIONS

International Search Report for Appl. No. PCT/KR2012/007933 dated Feb. 27, 2013 (w/ English translation).
Written Opinion of the International Searching Authority for Appl. No. PCT/KR2012/007933 dated Feb. 27, 2013 (w/ English translation).

* cited by examiner

*Primary Examiner* — Edward Tso
*Assistant Examiner* — Aaron Piggush
(74) *Attorney, Agent, or Firm* — Birch, Stewart, Kolasch & Birch, LLP

(57) ABSTRACT

The present invention relates to a battery management system and a battery management method. The battery management system for managing a battery including at least one cell comprises: an SOH (State of Charge) estimating unit for determining estimation parameters for estimating an SOC of the battery; and a controller for updating a pattern table for estimating a pattern of use on a charge and discharge cycle of the battery, based on the estimation parameters. The pattern table includes a plurality of pattern counters, and the plurality of pattern counters correspond to a plurality of estimation ranges, respectively. The controller determines to which estimation range from among the plurality of estimation ranges the estimation parameters correspond, and updates a value of a pattern counter corresponding to the determined estimation range from among the plurality of pattern counters.

17 Claims, 3 Drawing Sheets

BATTERY MANAGEMENT SYSTEM AND BATTERY MANAGEMENT METHOD

This application is a continuation of PCT International Application No. PCT/KR2012/007933 filed on Sep. 28, 2012, which claims priority to and the benefit of Korean Patent Application No. 10-2011-0100887 filed on Oct. 4, 2011 and Korean Patent Application No. 10-2012-0109005 filed on Sep. 28, 2012 in the Korean Intellectual Property Office, the entire contents of which are expressly incorporated herein by reference.

TECHNICAL FIELD

The present invention relates to a battery management system and a battery management method, and more particularly, to a battery management system and a battery management method for managing a battery that is capable of being charged and discharged.

BACKGROUND ART

Because vehicles that use fossil fuels have serious effects on the generation of environmental pollution such as air pollution, electric vehicles or hybrid vehicles that generate almost no pollution have recently been developed and used. Electric vehicles or hybrid vehicles are configured to use the electric energy output from a battery installed therein to run. Also, a battery that is a power source for these vehicles is used with a plurality of secondary battery cells configured in one pack. Accordingly, the performance of a battery used in an electric vehicle or a hybrid vehicle is directly related to the performance of the vehicle, and a BMS (Battery Management System) for efficiently controlling the performance of the battery is required.

A battery management system performs the functions of: estimating a cell voltage, an overall battery voltage and current, and the like so as to efficiently manage the charging and discharging of cells; estimating an SOC (State of Charge) of cells, by calculation; and controlling the SOC. The estimating of the SOC may be performed by detecting the voltage, current, temperature, etc. of the cells, and the estimated SOC is controlled to more effectively control the power consumption of the battery.

The SOH (State of Health) of a battery is reduced according to an increase in the number of charge and discharge cycles thereof. Therefore, the number of charge and discharge cycles becomes a measure by which the SOH of the battery is estimated. Therefore, there is a need for a battery management system to manage information on the charge and discharge cycles of a battery and relay the information to a user in order to estimate the SOH of the battery.

A method that is used for managing information on the charge and discharge cycles of a battery according to the related art is one that simply performs counting when a certain value of the SOC or a certain value of an OCV (Open Circuit Voltage) is exceeded. However, with a method that performs counting only when a certain value is exceeded, it is difficult to obtain an accurate pattern of use for the charge and discharge cycles of a battery. Moreover, because an accurate pattern of use for the battery cannot be obtained, the estimation of the SOC of the battery, the maintenance of the battery, and the reliability in use of the battery all suffer.

DETAILED DESCRIPTION OF THE INVENTION

Technical Problem

The present invention provides a battery management system and a battery management method, which perform regular and step-by-step counting of a battery SOC and more effectively analyze the charge and discharge cycles of the battery.

The present invention provides a battery management system and a battery management method, which more accurately predict the SOH of a battery by using the charge and discharge cycles of the battery, and improve the efficiency in use and the maintenance and repair efficiency of the battery.

Technical Solution

In one aspect, a battery management system, for managing a battery including at least one cell, is provided with an SOC (State of Charge) estimating unit for determining estimation parameters for estimating the SOC of the battery, and a controller for updating a pattern table for estimating a pattern of use on a charge and discharge cycles of the battery, based on the estimation parameters. The pattern table includes a plurality of pattern counters, the plurality of pattern counters corresponding to a plurality of estimation ranges, respectively. The controller determines to which estimation range from among the plurality of estimation ranges the estimation parameters correspond, and updates a value of a pattern counter corresponding to the determined estimation range from among the plurality of pattern counters.

The number of the plurality of estimation ranges may be N (where N>1), the size of each of the plurality of estimation ranges may be K, each of the plurality of estimation ranges may have an index n set from 1 to N, and each of the plurality of estimation ranges may have a range between 100-nK and 100-(n−1)K.

The controller may determine whether the estimation parameters correspond to an estimation range that has the index value n, and may increase a value of the pattern countercorresponding to an estimation range that has the determined index value n, from among the plurality of pattern counters.

The controller sequentially may increase the index value n from a smallest value or sequentially decrease the index value n from the greatest value, and determine whether the estimation parameters correspond to an estimation range that has the index value n.

The estimation parameters may be one of an OCV (Open Circuit Voltage) of the battery, an SOC of the battery, a voltage of the battery, and a charging or discharging current of the battery.

The estimation parameters may be determined at regular time intervals, and values of the plurality of pattern counters may be updated based on the estimation parameters.

The system may further comprise an SOH (State of Health) predicting unit predicting a pattern of use for a charge and discharge cycle of the battery, based on values of the plurality of pattern counters, and estimating an SOH of the battery.

In another aspect, a battery management method, for managing a battery including at least one cell, comprises the steps of: determining estimation parameters for estimating an SOC (State of Charge) of the battery; and updating a pattern table for estimating a pattern of use for a charge and discharge cycle of the battery, based on the estimation parameters, wherein the pattern table includes a plurality of pattern counters, and the plurality of pattern counters correspond to a plurality of estimation ranges, respectively.

The step of updating the pattern table may include the steps of: determining to which estimation range from among the plurality of estimation ranges the estimation parameters correspond; and updating a value of a pattern counter corresponding to the determined estimation range, from among the plurality of pattern counters.

The number of the plurality of estimation ranges may be N (where N>1), the size of each of the plurality of estimation ranges may be K, each of the plurality of estimation ranges may have an index n set from 1 to N, and each of the plurality of estimation ranges may have a range between 100-nK and 100-(n-1)K.

The step of updating the pattern table may include the steps of: determining whether the estimation parameters correspond to an estimation range that has the index value n; and increasing a value of a pattern counter corresponding to an estimation range that has the determined index value n, from among the plurality of pattern counters.

The index value n may be sequentially increased from a smallest value or the index value n may be sequentially decreased from the greatest value, and whether the estimation parameters correspond to an estimation range that has the index value n may be determined.

The estimation parameters may be one of an OCV (Open Circuit Voltage) of the battery, an SOC of the battery, a voltage of the battery, and a charging or discharging current of the battery.

The estimation parameters may be determined at regular time intervals, and values of the plurality of pattern counters may be updated based on the estimation parameters.

The method may further include a step of predicting a pattern of use for a charge and discharge cycle of the battery, based on values of the plurality of pattern counters, and estimating an SOH (State of Health) of the battery.

The method may further include a step of outputting at least one of the pattern of use and the SOH to a user.

The method may further include the step of storing the updated pattern table in a memory.

In a further aspect, a battery management method managing a battery including at least one cell, includes the steps of: reading values of a plurality of pattern counters stored in a memory for predicting a pattern of use for a charge and discharge cycle of the battery; determining estimation parameters for estimating an SOC (State of Charge) of the battery; updating at least one of the plurality of pattern counters, based on the estimation parameters; and storing at least one of the plurality of updated pattern counters in the memory.

The plurality of pattern counters may correspond to a plurality of estimation ranges, respectively, the number of the plurality of estimation ranges may be N (where N>1), the size of each of the plurality of estimation ranges may be K, each of the plurality of estimation ranges may have an index n set from 1 to N, and each of the plurality of estimation ranges may have a range between 100-nK and 100-(n-1)K.

The step of updating at least one of the plurality of pattern counters may include the steps of: determining to which of the plurality of estimation ranges the estimation parameters correspond; and updating a value of a pattern counter corresponding to the determined estimation range, from among the plurality of pattern counters.

The estimation parameters may be one of an OCV (Open Circuit Voltage) of the battery, an SOC of the battery, a voltage of the battery, and a charging or discharging current of the battery.

Advantageous Effects

The SOH of a battery may be accurately estimated by further updating and recording a pattern of use for charge and discharge cycles of the battery. Also, the efficiency in use and the maintenance and repair efficiency of the battery may be improved through more accurately estimating the SOH of the battery.

BEST MODE

Figure 1:
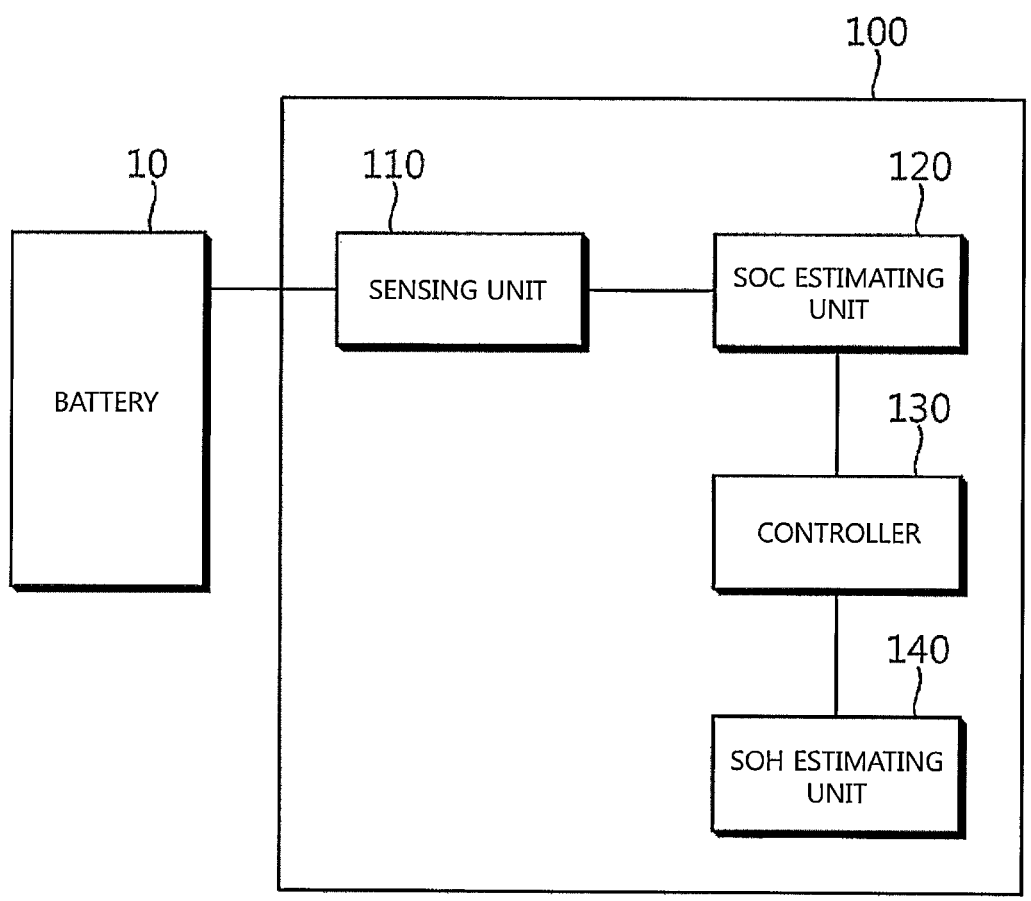
FIG. 1 is a block diagram illustrating a battery management system according to an exemplary embodiment of the present invention.

The vocabulary or terminology used in exemplary examples of the present invention described hereinafter shall not be interpreted as being limited to having a common or dictionary meaning, and shall be interpreted as having a meaning and concept suitable for the technical spirit of the present invention. Accordingly, the exemplary embodiments set forth in the detailed description of the present invention and the structures illustrated in the drawings are but one exemplary embodiment of the present invention, and do not represent the entire technical concept of the present invention. It will be understood that various equivalents and modified examples may replace such structures.

FIG. 1 is a block diagram illustrating a battery management system according to an exemplary embodiment of the present invention.

Referring to FIG. 1, a battery management system 100 according to an exemplary embodiment of the present invention is for managing a battery 10 including at least one battery cell.

The battery 10 may be formed as a battery pack in which a plurality of battery cells is connected in series and/or in parallel. Also, the battery 10 may be configured as a plurality of battery packs.

In the present invention, the type of the battery 10 is not particularly limited, and may be a secondary battery, that is capable of being charged and discharged, such as a lithium ion battery, lithium polymer battery, a nickel cadmium battery, a nickel hydrogen battery, and a nickel zinc battery.

The battery management system 100 includes a sensing unit 110, an SOC estimating unit 120, a controller 130, and an SOH estimating unit 140.

The sensing unit 110 senses at least one of the charging and/or discharging current of the battery 10, the voltage of the battery 10, and the temperature of the battery 10. More particularly, the sensing unit 110 senses the overall pack current of the battery 10, the overall pack voltage of the battery 10, the current of each battery cell, the voltage of each battery cell, the temperature of each battery cell, the ambient temperature, and so forth. A selected portion or the entirety of the sensed data is relayed to the SOC estimating unit 120.

The SOC estimating unit 120 is a component that estimates the SOC (State of Charge) of the battery 10, and determines estimation parameters for estimating the SOH of the battery 10.

The estimation parameters may be data such as the voltage of each battery cell included in the battery 10 (that is, an OCV (Open Circuit Voltage) of each battery cell), or the SOC of the battery 10 itself. Also, the estimation parameters may be data such as a charging and/or discharging current of the battery 10 sensed by the sensing unit 110, an accumulated value of the charging and/or discharging current, the temperature of the battery 10, etc.

The estimation parameters may use various parameters other than those described above for predicting a pattern of use for the charge and/or discharge cycle of the battery 10.

For example, the SOC estimating unit 120 may estimate an OCV of a cell excluding the effect of current on each battery cell, based on the voltage of each battery cell sensed by the sensing unit 110, to determine as estimation parameters. Also, the SOC estimating unit 120 may estimate an SOC based on many types of state values of the battery 10 such as an OCV of each battery cell, the overall pack voltage of the battery 10, the current of the battery 10, etc. This SOC may be determined as an estimation parameter.

The SOC estimating method may be implemented as various methods.

For example, a Coulomb counting method may be used. The charged and/or discharged current of a battery is estimated, and a multiplied value is calculated of the estimated current value multiplied by charging efficiency. The multiplied value is calculated at regular time intervals, and the currently calculated multiplied value is integrated with the previously calculated multiplied value to calculate an integrated capacity. The integrated capacity is used as a basis to estimate the SOC of the battery.

As another example, an OCV (Open Circuit Voltage) may be used. Pair data is estimated in plurality, which pairs a charging and/or discharging current with a corresponding voltage of the battery. A least squares method is used to obtain a first current-voltage approximating line from the estimated plurality of pair data, and a voltage value corresponding to a current value of 0 is calculated as an open circuit voltage. The OCV is used as a basis for estimating the SOC of the battery.

Of course, various methods other than the examples above may be used to estimate the SOC of the battery.

The controller 130 updates a pattern table for predicting a pattern of use for charge and discharge cycles of the battery 10, based on the estimation parameters determined by the SOC estimating unit 120. The pattern table includes a plurality of pattern counters. The plurality of pattern counters correspond to a plurality of estimation ranges, respectively.

That is, the controller 130 determines to which estimation range from among the plurality of estimation ranges the estimation parameters determined by the SOC estimating unit 120 correspond, and updates the value of a pattern counter corresponding to a determined estimation range from among the plurality of pattern counters.

Here, the pattern table may be stored in a memory such as RAM, EEPROM, etc. For example, the controller 130 may read a pattern table stored in a memory, update values of a plurality of pattern counters for pattern tables based on estimation parameters, and then store the updated pattern table again in the memory.

The SOH estimating unit 140 estimates the SOH (State of Health) of the battery 10. That is, a pattern of use for the charge and discharge cycles of the battery 10 is predicted on the basis of the values of the pattern counter of the pattern table updated by the controller 130, and an SOH of the battery 10 is estimated on that basis.

As described above, the battery management system 100 according to the present invention may determine estimation parameters at regular time intervals by means of the SOC estimating unit, and may update values of a plurality of pattern counters by means of the controller 130, based on the estimation parameters.

For example, estimation parameters may be estimated at each preset time interval, which may be used to update the values of the plurality of pattern counters. Alternatively, estimation parameters may be estimated by a control signal for estimating the estimation parameters, which may be used to update the values of the plurality of pattern counters.

Figure 2:
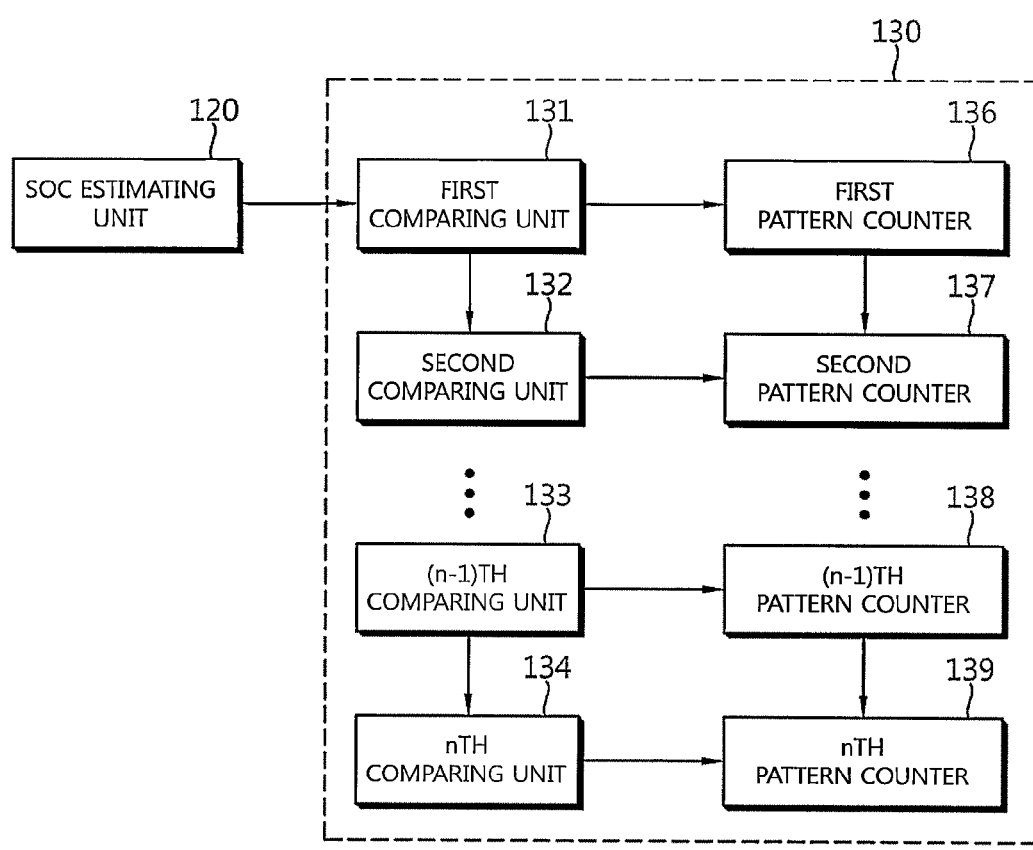
FIG. 2 is a block diagram illustrating in further detail a controller of the battery management system illustrated in FIG. 1.

FIG. 2 is a block diagram illustrating in further detail a controller of the battery management system illustrated in FIG. 1. The controller illustrated in FIG. 2 is but one example, and the present invention is not limited thereto.

Referring to FIG. 2, the controller 130 includes a plurality of comparing units 131, 132, 133, and 134, and a plurality of pattern counters 136, 137, 138, and 139.

The plurality of comparing units 131, 132, 133, and 134 are components for determining to which estimation range from among a plurality of estimation ranges the estimation parameters relayed from the SOC estimating unit 120 correspond.

The plurality of comparing units 131, 132, 133, and 134 correspond to a plurality of estimation ranges, respectively. That is, the comparing units 131, 132, 133, and 134 each have one estimation range set from among the plurality of estimation ranges. The estimation ranges set for the comparing units 131, 132, 133, and 134, respectively, are mutually different estimation ranges. Further, estimation ranges are set sequentially from a first comparing unit 131 to an nth comparing unit 134.

For example, when the number of the plurality of estimation ranges is N (where N>1), and the size of each of the plurality of estimation ranges is K, an index n (where n=1, 2, 3, . . . , N) may be set for each of the plurality of estimation ranges. Here, each of the plurality of estimation ranges may have a range between 100-nK and 100-(n-1)K. Accordingly, index values of n (where n-1, 2, 3, . . . , N) that are the estimation ranges, respectively, may be set from the first comparing unit 131 to the nth comparing unit 134. For example, the index value 1 that is an estimation range (100-1*K to 100-0*K) may be set for the first comparing unit 131, and the index value 2 that is the estimation range (100-2*K to 100-1*K) may be set for the second comparing unit 132.

The plurality of pattern counters 136, 137, 138, and 139 correspond to the plurality of comparing units 131, 132, 133, and 134, respectively. The pattern counters 136, 137, 138, and 139 may be counters structured in a circuit, or may be embodied as software.

When receiving estimation parameters from the SOC estimating unit 120, the controller 130 determines if the estimation parameters correspond to an estimation range set in the first comparing unit 131. If the estimation parameters correspond to the estimation range set for the first comparing unit 131, the value of the first pattern counter 136 is increased. Conversely, if the estimation parameters do not correspond to the estimation range set for the first comparing unit 131, the parameters are compared to the estimation range set for the second comparing unit 132. Likewise, comparing is sequentially continued to the nth comparing unit 134 until an estimation range is found in which the estimation parameters fall.

The above-described plurality of comparing units 131, 132, 133, and 134 and the plurality of pattern counters 136, 137, 138, and 139 may be embodied as a pattern table.

Figure 3:
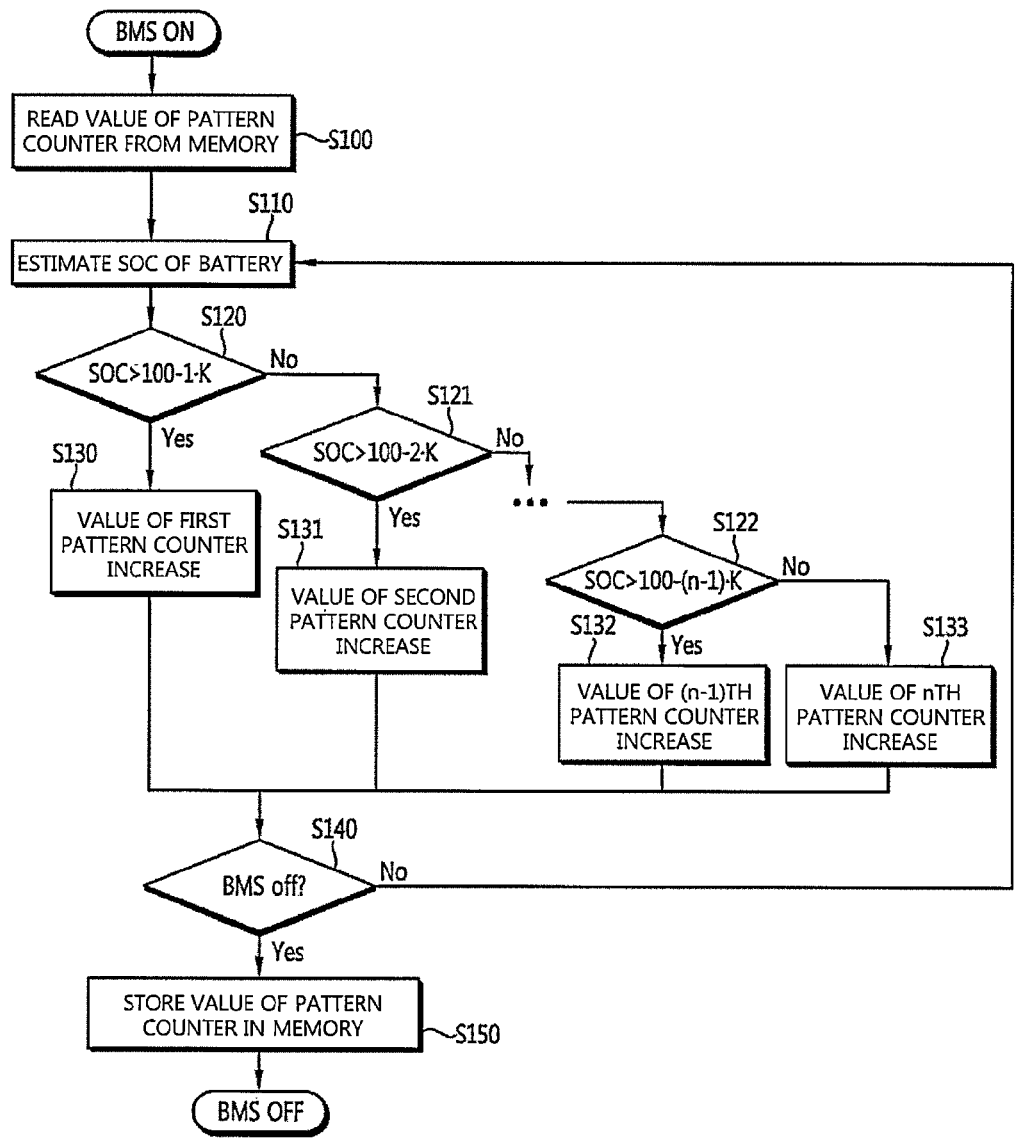
FIG. 3 is a flowchart illustrating a battery management method according to an exemplary embodiment of the present invention.

FIG. 3 is a flowchart illustrating a battery management method according to an exemplary embodiment of the present invention. This method may be performed by the battery management system 100 illustrated in FIG. 1.

Referring to FIG. 3, the battery management system 100 reads a pattern table, or a plurality of pattern counters stored in a memory in step S100. If the battery management system is operating for the first time, all of the value of pattern counters may be 0.

The plurality of pattern counters may be embodied as the above-described pattern table, or only values of a plurality of pattern counters without the pattern table may be stored in the memory. The plurality of pattern counters correspond to a plurality of estimation ranges, respectively.

For example, when the number of the plurality of estimation ranges is N (where N>1), and the size of each of the plurality of estimation ranges is K, an index n (where n=1, 2, 3, ..., N) may be set for each of the plurality of estimation ranges from 1 to N. Here, each of the plurality of estimation ranges may have a range between 100-nK and 100-(n-1)K. A pattern table may be formed as illustrated in Table 1, for example.

TABLE 1

| Index n | Index 1<br>100 to<br>100 – 1 * K<br>First<br>Pattern<br>Counter | Index 2<br>100 – 1 * K to<br>100 – 2 * K<br>Second<br>Pattern<br>Counter | ... | Index N<br>100 – (N – 1) * K<br>to 100 – N * K<br>nth<br>Pattern<br>Counter |
|---|---|---|---|---|
| Estimation Range |  |  |  |  |
| 1st | 0 | 0 | ... | 0 |
| 2nd | 1 | 0 |  | 0 |
| 3rd | 2 | 0 |  | 0 |
| 4th | 2 | 1 |  | 0 |
| 5th | 2 | 1 |  | 0 |
| 6th | 3 | 1 |  | 0 |
| 7th | 3 | 1 |  | 0 |
| ... | ... | ... |  | 0 |
| nth | $X_1$ | $X_2$ |  | $X_r$ |

A battery management system 100 determines estimation parameters in step S110 to estimate an SOC of the battery 10. In step S110, data (for example, battery current, voltage, temperature, etc.) on the battery 10 sensed by the sensing unit 110 may be used to determine estimation parameters by the SOC estimating unit 120.

The estimation parameters, as described above, may be a voltage of each battery cell included in the battery 10 (that is, an OCV (Open Circuit Voltage) of each battery cell), or may be an SOC of the battery 10 itself. Also, the estimation parameters may use various parameters for predicting a pattern of use for charge and/or discharge cycles of the battery 10. For example the estimation parameters may be a charging and/or discharging current of the battery 10 sensed by the sensing unit 110, an accumulated value of the charging and/or discharging current, the temperature of the battery 10, etc.

The SOC estimating may use, as described above, a Coulomb counting method, an open circuit voltage, and various other methods.

FIG. 3 illustrates an SOC of a battery 10 used as an estimation parameter in one exemplary embodiment.

Step S110 may be performed before step S100 or may be performed at the same time as step S100.

The battery management system 100 updates a pattern table (that is, values of a plurality of pattern counters), on the basis of the estimation parameters.

In further detail, the controller 130 determines in steps S120 to S122 to which estimation range from among the plurality of estimation ranges estimation parameters (for example, the SOC of the battery) correspond, and updates in steps S130 to S133 the values of the pattern counters corresponding to the estimation range determined from among the plurality of pattern counters.

For example, referring to Table 1, the controller 130 determines in steps S120 to S122 whether the estimation parameters correspond to the estimation range that has the index value n, and increases a value of a pattern counter that corresponds to the estimation range that has the determined index value n from among the plurality of pattern counters.

Referring to FIG. 3, the controller 130 (may be implemented by 131 in FIG. 2) compares in step 120 whether the estimation parameters correspond to the estimation range of 100 to 100-1*K that has the index value 1. If the estimation parameters correspond to the estimation range of 100 to 100-1*K that has the index value 1, the value of the first pattern counter is increased in step S130. Conversely, if the estimation parameters do not correspond to the estimation range of 100 to 100-1*K that has the index value 1, the controller 130 (may be implemented by 132 in FIG. 2) compares in step S121 whether the estimation parameters correspond to the estimation range of 100-1*K to 100-2*K that has the index value 2.

Through this method, comparing may be sequentially performed until an estimation range in which the estimation parameters fall is found. That is, the index value n may be sequentially increased from the smallest value, or the index value n may be sequentially decreased from the greatest value, and a comparison may be made of whether the estimation parameters correspond to an estimation range that has the index value n.

The above steps determine the estimation parameters for estimating an SOC of the battery at regular time intervals, based on the estimation parameters, values of a plurality of pattern counters are updated.

For example, when the battery management system 100 starts, estimation parameters for estimating an SOC are determined, based on the estimation parameters, values of a plurality of pattern counters may be updated as a value like the first cycle illustrated in Table 1. After a preset regular time interval elapses, or after a control signal is sensed, estimation parameters are determined again, based on the estimation parameters, the values of the plurality of pattern counters may be updated as the value like the second cycle illustrated in FIG. 2. Likewise, while the battery management system 100 operates, values of a plurality of pattern counters may be continuously updated and recorded on the pattern table.

When an end request is received in step S140, the battery management system 100 ultimately stores an updated pattern table, (that is, values of a plurality of pattern counters) in a memory in step S150.

The values of the plurality of pattern counters may be stored in the memory when the operation of the battery management system 100 is ended, or may be stored at regular time intervals in the memory.

The battery management system 100 estimates a pattern of use for charged and discharged cycles of the battery 10 on the basis of the above-described plurality of counter values, and may further include a step of using the pattern of use to estimate the SOH of the battery 10.

Also, the battery management system 100 may have a display device, and the step may be further included of outputting at least one from a predicted pattern of use for the battery 10 and the SOH of the battery 10 to a user, based on the above-described values of the plurality of pattern counters.

The battery management system and the battery management method according to the above-described embodiments of the present invention store a pattern of use for charge and discharge cycles of a battery, so that the pattern may be used when performing maintenance and repair on the battery at a later time. Accordingly, the operating efficiency of the battery may be improved, and the operating reliability of the battery may be improved.

The exemplary embodiments of the present invention described above shall not be interpreted as limiting the technical spirit of the present invention. The scope of protection of the present invention is only limited to what is set forth in the scope of the claims, and a person having ordinary skill in the art to which the present invention pertains will be able to modify the technical spirit of the present invention into various forms. Accordingly, such modifications and changes, when being obvious to a person having ordinary skill in the art, shall fall within the scope of protection of the present invention.

The invention claimed is:

1. A battery management system for managing a battery including at least one cell, the system comprising:
   an SOC (State of Charge) estimating unit for determining estimation parameters for estimating an SOC of the battery; and
   a controller for updating a pattern table for estimating a pattern of use on a charge and discharge cycle of the battery, based on the estimation parameters,
   wherein the pattern table includes a plurality of pattern counters, the plurality of pattern counters corresponding to a plurality of estimation ranges, respectively, and the controller determines to which estimation range from among the plurality of estimation ranges the estimation parameters correspond, and updates a value of a pattern counter corresponding to the determined estimation range, from among the plurality of pattern counters, and
   wherein the number of the plurality of estimation ranges is N (where N>1), the size of each of the plurality of estimation ranges is K, each of the plurality of estimation ranges has an index n set from 1 to N, and each of the plurality of estimation ranges has a range between 100-nK and 100-(n−1)K.

2. The system according to claim 1, wherein the controller determines whether the estimation parameters correspond to an estimation range that has the index value n, and increases a value of a pattern countercorresponding to an estimation range that has the determined index value n, from among the plurality of pattern counters.

3. The system according to claim 2, wherein the controller sequentially increases the index value n from a smallest value or sequentially decreases the index value n from the greatest value, and determines whether the estimation parameters correspond to an estimation range that has the index value n.

4. The system according to claim 1, wherein the estimation parameters are one of an OCV (Open Circuit Voltage) of the battery, an SOC of the battery, a voltage of the battery, and a charging or discharging current of the battery.

5. The system according to claim 1, wherein the estimation parameters are determined at regular time intervals, and values of the plurality of pattern counters are updated based on the estimation parameters.

6. The system according to claim 1, further comprising:
   an SOH (State of Health) predicting unit for predicting a pattern of use for a charge and discharge cycle of the battery, based on values of the plurality of pattern counters, and estimating an SOH of the battery.

7. A battery management method for managing a battery including at least one cell, comprising the steps of:
   determining estimation parameters for estimating an SOC (State of Charge) of the battery; and
   updating a pattern table for estimating a pattern of use for a charge and discharge cycle of the battery, based on the estimation parameters,
   wherein the pattern table includes a plurality of pattern counters, and the plurality of pattern counters correspond to a plurality of estimation ranges, respectively, and
   wherein the number of the plurality of estimation ranges is N (where N>1), the size of each of the plurality of estimation ranges is K, each of the plurality of estimation ranges has an index n set from 1 to N, and each of the plurality of estimation ranges has a range between 100-nK and 100-(n−1)K.

8. The method according to claim 7, wherein the step of updating the pattern table includes the steps of:
   determining to which estimation range from among the plurality of estimation ranges the estimation parameters correspond; and
   updating a value of a pattern counter corresponding to the determined estimation range from among the plurality of pattern counters.

9. The method according to claim 7, wherein the step of updating the pattern table includes the steps of:
   determining whether the estimation parameters correspond to an estimation range that has the index value n; and
   increasing a value of a pattern counter corresponding to an estimation range that has the determined index value n, from among the plurality of pattern counters.

10. The method according to claim 9, wherein the index value n is sequentially increased from a smallest value or the index value n is sequentially decreased from the greatest value, and whether the estimation parameters correspond to an estimation range that has the index value n is determined.

11. The method according to claim 7, wherein the estimation parameters are one of an OCV (Open Circuit Voltage) of the battery, an SOC of the battery, a voltage of the battery, and a charging or discharging current of the battery.

12. The method according to claim 7, wherein the estimation parameters are determined at regular time intervals, and values of the plurality of pattern counters are updated based on the estimation parameters.

13. The method according to claim 7, further comprising:
   the step of predicting a pattern of use for a charge and discharge cycle of the battery, based on values of the plurality of pattern counters, and estimating an SOH (State of Health) of the battery.

14. The method according to claim 7, further comprising:
   the step of storing the updated pattern table in a memory.

15. A battery management method managing a battery including at least one cell, comprising the steps of:
   reading values of a plurality of pattern counters stored in a memory for predicting a pattern of use for a charge and discharge cycle of the battery;
   determining estimation parameters for estimating an SOC (State of Charge) of the battery;
   updating at least one of the plurality of pattern counters, based on the estimation parameters; and
   storing at least one of the plurality of updated pattern counters in the memory,
   wherein the plurality of pattern counters correspond to a plurality of estimation ranges, respectively, the number of the plurality of estimation ranges is N (where N>1), the size of each of the plurality of estimation ranges is K, each of the plurality of estimation ranges has an index n set from 1 to N, and each of the plurality of estimation ranges has a range between 100-nK and 100-(n−1)K.

16. The method according to claim 15, wherein the step of updating at least one of the plurality of pattern counters includes the steps of:
- determining to which estimation range from among the plurality of estimation ranges the estimation parameters correspond; and
- updating a value of a pattern counter corresponding to the determined estimation range, from among the plurality of pattern counters.

17. The method according to claim 15, wherein the estimation parameters are one of an OCV (Open Circuit Voltage) of the battery, an SOC of the battery, a voltage of the battery, and a charging or discharging current of the battery.

* * * * *